United States Patent
Wong et al.

(10) Patent No.: US 6,369,570 B1
(45) Date of Patent: Apr. 9, 2002

(54) B1 GRADIENT COILS

(75) Inventors: Wai Ha Wong, San Jose; Subramaniam Sukumar, Union City, both of CA (US)

(73) Assignee: Varian, Inc., Palo Alto, CA (US)

( * ) Notice: Subject to any disclaimer, the term of this patent is extended or adjusted under 35 U.S.C. 154(b) by 0 days.

(21) Appl. No.: 09/747,818

(22) Filed: Dec. 21, 2000

(51) Int. Cl.⁷ .................................................. G01V 3/00
(52) U.S. Cl. ..................... 324/318; 324/320; 324/307
(58) Field of Search .............................. 324/318, 319, 324/320, 307

(56) References Cited

U.S. PATENT DOCUMENTS

| | | | |
|---|---|---|---|
| 4,694,555 A | | 9/1987 | Hayes ..................... 324/318 |
| 4,757,290 A | * | 7/1988 | Keren ..................... 324/318 |
| 5,323,113 A | | 6/1994 | Cory et al. ............... 324/318 |
| 5,642,048 A | * | 6/1997 | Crozier et al. ........... 324/318 |
| 5,680,046 A | * | 10/1997 | Frederick et al. ........ 324/318 |
| 5,898,306 A | * | 4/1999 | Liu et al. ................ 324/322 |
| 5,990,681 A | * | 11/1999 | Richard et al. .......... 324/322 |
| 6,043,658 A | * | 3/2000 | Leussier ................. 324/318 |
| 6,133,737 A | * | 10/2000 | Greim .................... 324/318 |

OTHER PUBLICATIONS

Article by Vullo, et al., entitled "Experimental Design and Fabrication of Birdcage Resonators for Magnetic Resonance Imaging", published in *Magnetic Resonance in Medicine*, vol. 24, pp. 24–252 (1992).

* cited by examiner

*Primary Examiner*—Hezron Williams
*Assistant Examiner*—Dixomara Vargas
(74) *Attorney, Agent, or Firm*—Bella Fishman

(57) ABSTRACT

A birdcage-like coil with a pair of electrically conductive ring elements separated in a longitudinal direction and interconnected by three longitudinally extending electrically conductive elongated strips, two of which are diametrically oppositely disposed and the third is azimuthally at 90E from both of them, can create an RF magnetic field gradient when driven in a certain resonance mode. A similarly structured birdcage-like coil with a fourth strip to have two diametrically oppositely disposed strips can create two switchable orthogonal magnetic field gradient by switching off a selected one of the strips and driving the coil in a certain mode. A coil for generating alternative a homogeneous field and selectably one of two orthogonal gradient fields is formed by sandwiching a prior art birdcage long-pass coil with a pair of such coils and by switching on and off suitable ones of the switches in the strips.

15 Claims, 4 Drawing Sheets

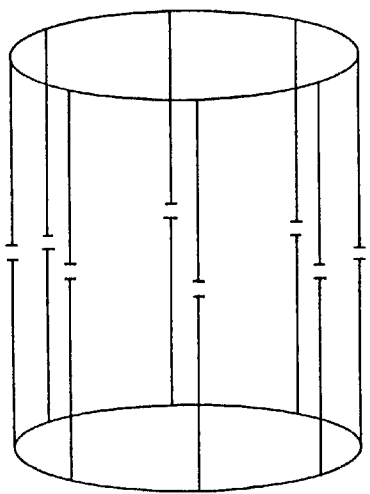
FIG. IA
PRIOR ART
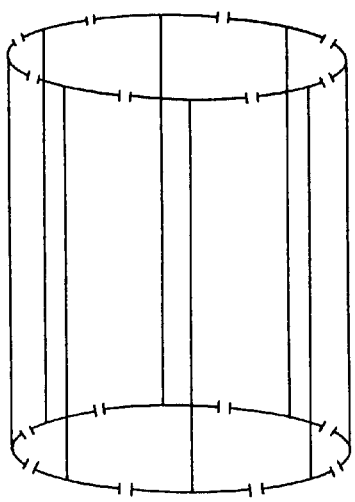
FIG. IB
PRIOR ART
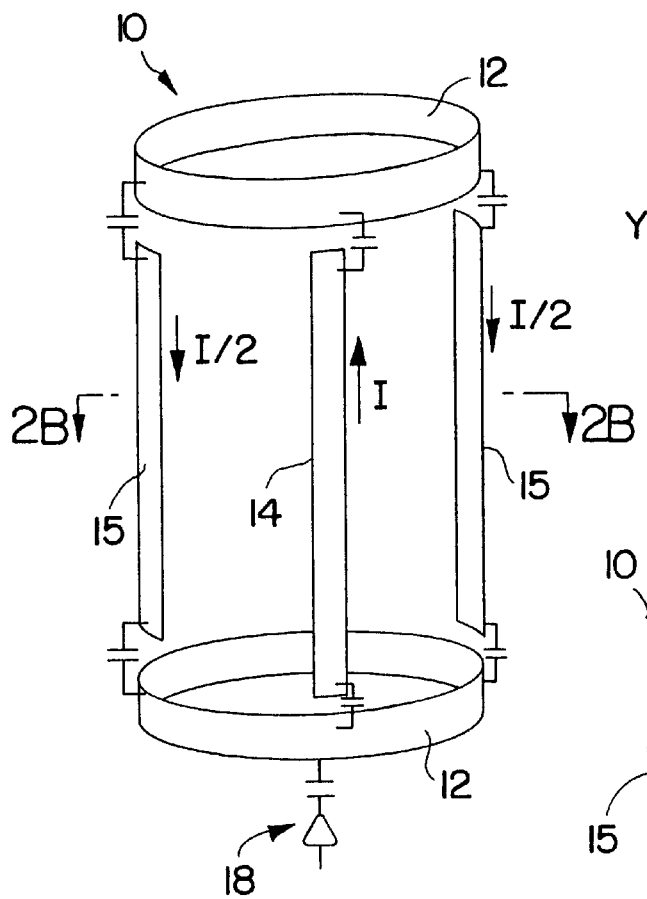
FIG. 2A
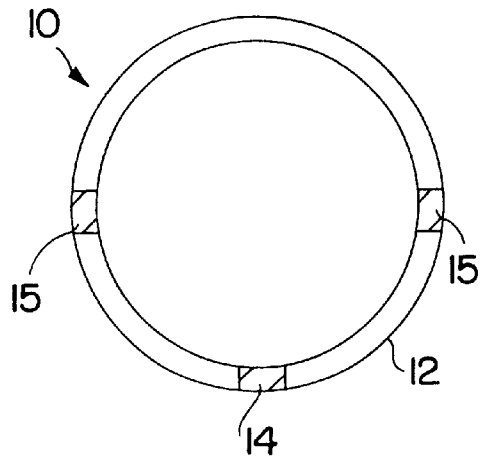
FIG. 2B

B1 GRADIENT COILS

BACKGROUND OF THE INVENTION

This invention relates to high-resolution nuclear magnetic resonance (NMR) spectroscopy and imaging and in particular to so-called X-Y B1 gradient coils for producing two quickly switchable orthogonal magnetic field gradients in a plane which is perpendicular to the direction of a homogeneous static magnetic RF field.

It has been known to take advantage of a magnetic field with a gradient in NMR spectroscopy. U.S. Pat. No. 5,323,113 issued Jun. 21, 1994 to Cory et al, for example, disclosed an NMR probe for generating both a homogeneous RF field over a sample volume and a radial field comprising two orthogonal gradient fields in a plane transverse to the homogeneous field. The structure with two coils connected in parallel to a signal generator tends to give rise to interference problems. No commercially available coils of this kind exist within the knowledge of the inventors herein.

It has also been known to structure a radio-frequency coil like a birdcage in order to obtain a highly homogeneous magnetic field as described, for example, in U.S. Pat. No. 4,694,255 issued Sep. 15, 1987 to C. Hayes and "Experimental Design and Fabrication of Birdcage Resonators for Magnetic Resonance Imaging" (T. Vullo, et al., Magnetic Resonance in Medicine, 24, 243 (1992)). Birdcage coils are so called because of their general structure having a pair of loop-shaped conductive elements (the "rings") separated in a longitudinal direction and a plurality of conductive segments (the "strips") evenly spaced about the circumference of and interconnecting these two loop-shaped conductive elements. Capacitors are inserted either in the strips for a low-pass coil, or in the rings for a high-pass coil, as illustrated in FIGS. 1A and 1B, respectively.

SUMMARY OF THE INVENTION

It is therefore an object of this invention to provide a birdcage-like coil for generating an improved RF magnetic field gradient.

It is another object of this invention to provide a birdcage-like X-Y B1 gradient coil for generating two quickly switchable orthogonal magnetic field gradients, say, in the X-direction and the Y-direction.

It is still another object of this invention to provide an improved X-Y B1 gradient coil for generating both a homogeneous RF field over a sample volume and a radial field comprising two orthogonal gradient fields without giving rise to unwanted interference between the so-called transmitter and receiver coils.

BRIEF DESCRIPTION OF THE DRAWINGS

The accompanying drawings, which are incorporated in and form a part of this specification, illustrate embodiments of the invention and, together with the description, serve to explain the principles of the invention. In the drawings:

FIGS. 1A and 1B are sketches showing birdcage coils respectively with low-pass and high-pass coil configurations;

FIG. 2A is a schematic diagonal view of a birdcage-like coil embodying this invention for generating an improved RF magnetic field gradient and FIG. 2B is a schematic sectional view taken along line 2B—2B in FIG. 2A, FIGS. 2A and 2B being hereinbelow together referred to as FIG. 2;

Those components which are similar, although components of different coils, may be indicated by the same symbols for the sake of convenience without repetitious explanations.

DETAILED DESCRIPTION OF THE INVENTION

Figure 5:
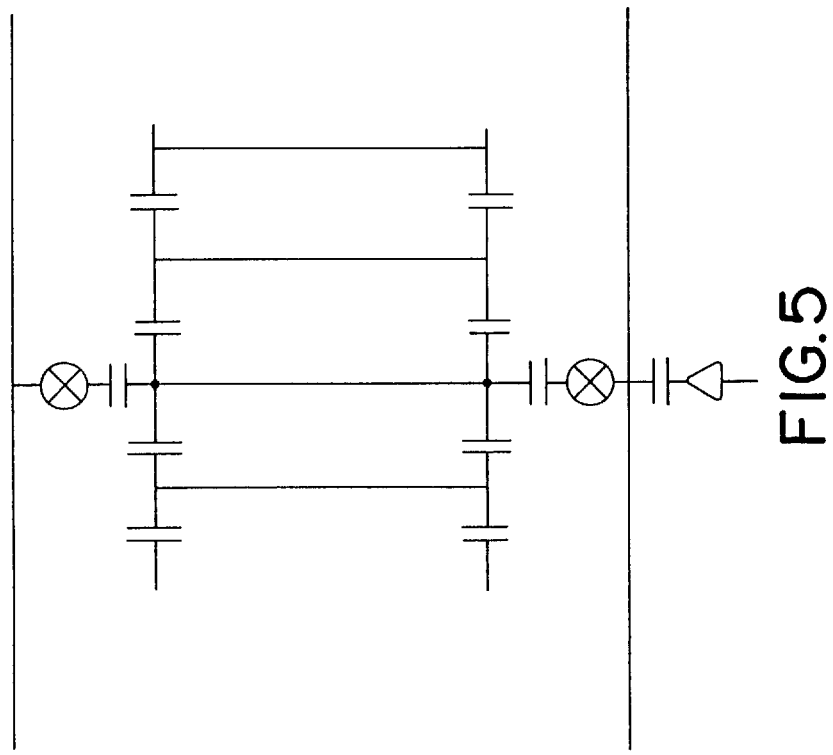
FIG. 5 is a circuit diagram of the coil of FIG. 4.

FIG. 2 shows schematically the structure of a birdcage-like coil 10 for generating an improved magnetic field gradient, characterized as comprising a pair of electrically conductive rings 12 which are mutually separated in a longitudinal direction parallel to the central axis of the birdcage-like shape of the coil 10. Unlike a real birdcage intended to keep a bird inside such that it cannot escape, the coil 10, according to a representative embodiment of the invention, has only three strips which are elongated members extending longitudinally (say, along the Z-direction) between the rings 12, interconnecting them at both ends and are not evenly spaced circumferentially along each of the rings 12. For the convenience of description, one of these three strips will be hereinafter referred to as the center strip 14 and the other two as the flanking strips 15, the flanking strips 15 being disposed diametrically opposite to each other (say, along a diameter in the X-direction) with respect to the rings 12 and the center strip 14 being at equidistance from them, that is, at a mid-way position therebetween separated azimuthally from both of the flanking strips 15 by 90E around the rings 12 (or on the diameter in the Y-direction). The invention does not impose any particular limitation on the physical structure of the rings 12 and the strips 14 and 15 except, as schematically shown in FIG. 2, that each of the strips 14 and 15 is capacitively coupled with the rings 12 at both ends. Methods of joining such a strip to a ring so as to form a capacitance therebetween have been known and will not be discussed herein.

Although only schematically shown in FIG. 2, the coil 10 is connected to a driving means 18, or an RF generator for operating the coil 10 in a resonance mode wherein as a current with intensity I flows through the center strip 14 in one longitudinal direction, a current of intensity I/2 will flow through each of the pair of flanking strips 15 in the opposite longitudinal direction. The coil 10 has another resonance mode wherein no current flows through the center strip 14 and as a current with intensity I flows through one of the flanking strips 15 in one longitudinal direction, another current of the same intensity I flows through the other of the flanking strips 15 in the opposite longitudinal direction. Since it is well understood by persons skilled in the art how to operate the driving means 18 to activate the coil 10 in a desired mode, operation of the driving means 18 will not be described in any detail.

With the coil 10 thus being operated, a magnetic field with a uniform gradient in the Y-direction is generated inside the birdcage-like structure.

The invention does not limit the number of the strips to be three. More strips may be provided, flanking the center strip 14. By controlling the current distribution among these strips, a more uniform gradient can be generated over a larger portion of the space inside the birdcage-like coil structure but the control of the driving means 18 will be accordingly more difficult.

Figure 3:
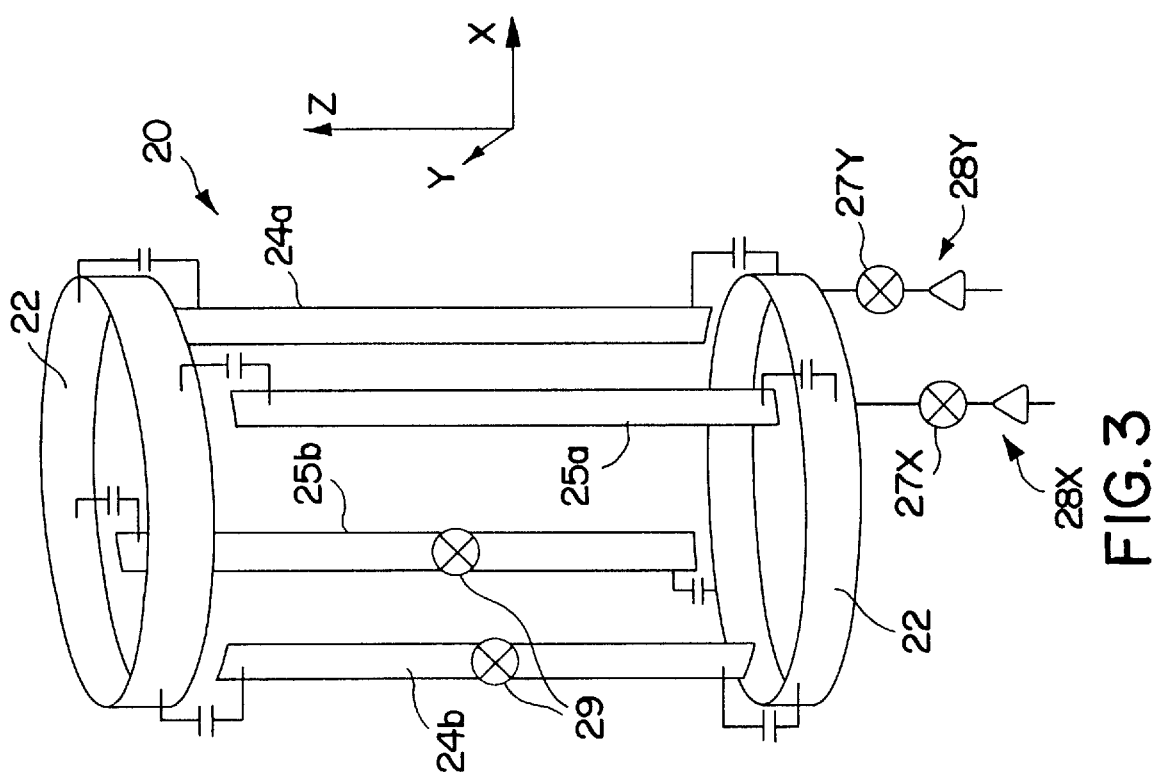
FIG. 3 is a schematic diagonal view of another birdcage-like coil embodying this invention for generating two quickly switchable orthogonal magnetic field gradients.

FIG. 3 shows schematically the structure of another birdcage-like coil 20 for generating two quickly switchable orthogonal magnetic field gradients, characterized as comprising, like the coil 10 explained above with reference to FIG. 2, a pair of electrically conductive rings 22 which are mutually separated in a longitudinal direction parallel to the central axis of the birdcage-like shape of the coil 20 and again referred to as the Z-direction. Unlike the coil 10 shown in FIG. 2, however, the coil 20 has four strips disposed equally spaced circumferentially around the rings 22 to form a birdcage-like structure, or a two pairs of mutually diametrically disposed strips with respect to the rings 22. For the convenience of description, the strips of one of the pairs (the "first pair") disposed on the diameter defining the X-direction will be indicated by 24a and 24b, and those of the other of the pairs (the "second pair") on the perpendicular diameter defining the Y-direction will be indicated by 25a and 25b. Each of the strips 24a, 24b, 25a and 25b is capacitively coupled to the rings 22.

Symbols 28x and 28y in FIG. 3 schematically indicate driving means for the coil 20, each connected to one of the rings 22 through a coupling capacitor and a switch 27. As shown also schematically in FIG. 3, one each of the strips of each of the pairs (24b and 25b) includes a switch 29. These switches may each comprise a pin diode. When a gradient in the Y-direction is desired, the switch 29 in the strip 25b and the switch 27 related to one of the driving means 28y are opened. The other driving means 28x, connected to the ring 22 operates the coil 20 in a mode wherein as a current with intensity I is caused to pass through the other of the strips of the second pair (25a) in one longitudinal direction, a current with intensity equal to I/2 will flow through each of the strips 24a and 24b of the first pair in the opposite longitudinal direction. It should be noted that the current configuration in this situation is identical to that described above with reference to FIG. 2, the strip 25a serving as the center strip and the strips 24a and 24b serving as the flanking strip of FIG. 2. Thus, there results inside the birdcage-like structure of FIG. 3 a magnetic field gradient in the Y-direction, the $B_1$ field strength being large near the strip 25a and dropping to zero at the position of the strip 25b.

Similarly, in a second mode of operation, the switch 29 in the strip 24b and the switch 27 related to the other of the driving means 28x are opened. The connected one of the driving means (28y) operates the coil 20 in this case such that as a current with intensity I is caused to pass through the connected one of the strips of the first pair (24a) in one longitudinal direction, a currents with intensity equal to I/2 will flow through each of the strips 25a and 25b of the second pair in the opposite longitudinal direction. In this case, the strip 24a serves as the center strip of FIG. 2 and the strips 25a and 25b serve as the flanking strip. Thus, there results inside the birdcage-like structure of FIG. 3 a magnetic field gradient in the X-direction, the $B_1$ field strength being large near the strip 24a and dropping to zero at the position of the strip 24b.

Figure 4:
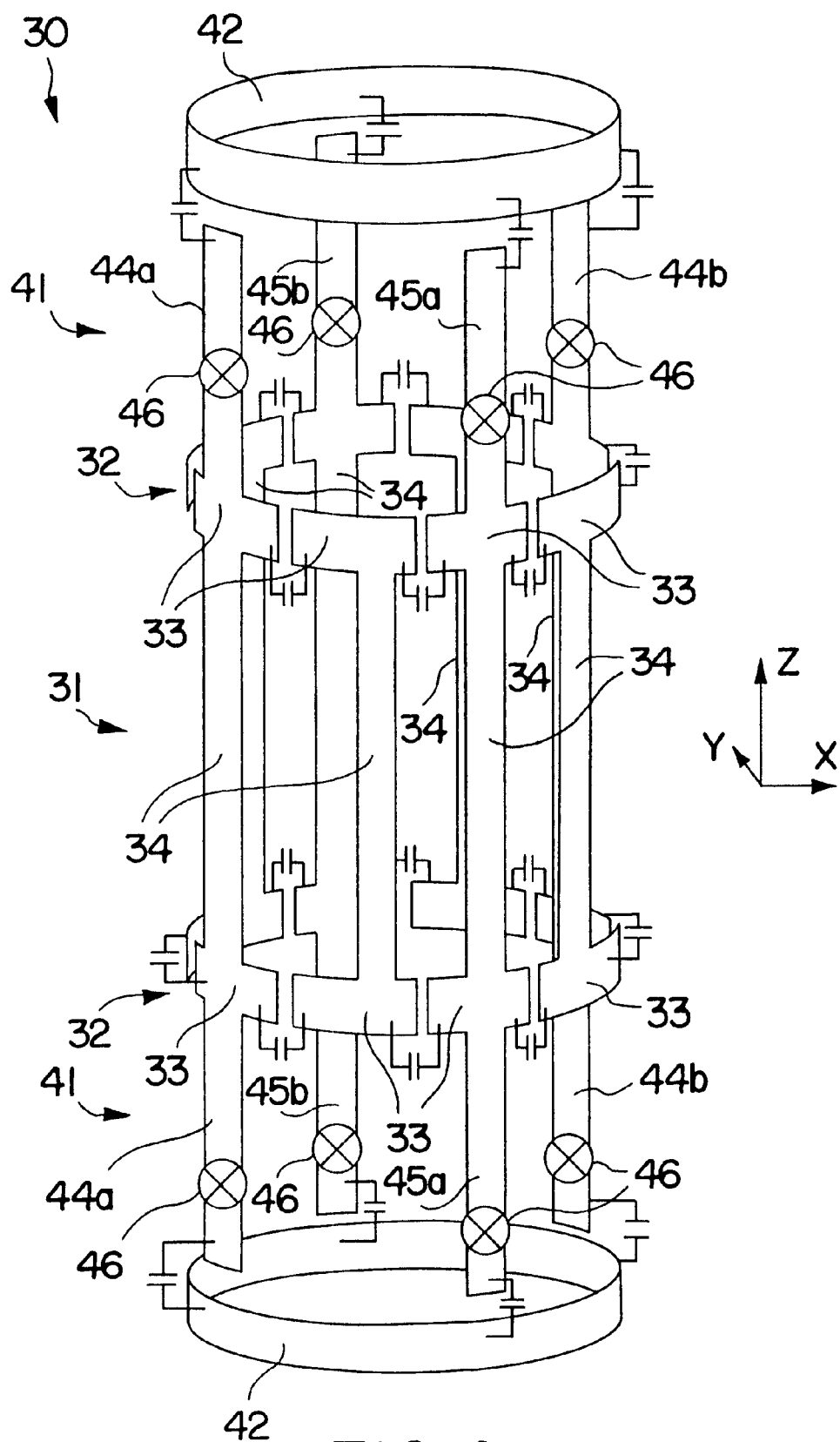
FIG. 4 is a schematic diagonal view of still another birdcage-like coil embodying this invention for generating both a homogeneous RF field and a radial field comprising two orthogonal gradient fields.

FIG. 4 shows schematically the structure of still another birdcage-like coil 30 for generating both a homogeneous RF field and a radial field comprising two orthogonal gradient fields. Described briefly, this coil 30 may be said to be a combination of a center coil 31, which is structured essentially like a prior art high-pass birdcage coil, and a pair of X-Y B1 gradient coils 41 on its both longitudinal ends so as to sandwich it in between. Thus, the center coil 31 is structured as schematically illustrated in FIG. 1B, having a pair of rings 32 which are separated in a longitudinal direction (the "Z-direction"), and a plural number of elongated members (the "strips") 34 extending in the Z-direction and interconnecting the rings 32 at junctions which are equally spaced circumferentially around the rings 32. Each of these rings 32 are circumferentially divided into the same plural number of segments 33 each having a corresponding one of these junctions thereon and each mutually adjacent pair of these segments 33 are mutually capacitively coupled so as to form a high-pass coil as illustrated in FIG. 1B.

Each of the X-Y B1 gradient coils 41 is structured essentially as shown in FIG. 3, that is, as a birdcage-like structure with two rings and four longitudinally extending strips 44a, 44b, 45a and 45b interconnecting them. Each of the gradient coils 41 makes use of a corresponding one of the rings 32 of the center coil 31 as one of its own rings. The other ring will be hereinafter referred to as the end ring 42. The four strips 44a, 44b, 45a and 45b are equally spaced circumferentially around the coils 32 and 42 and are each capacitively coupled with the end coil 42. The strips 44a and 44b make a diametrically disposed pair (the "first pair") of strips and the strips 45a and 45b make another diametrically disposed pair (the "second pair") of strips, the two pairs being disposed on two mutually perpendicular diameters (extending in the X-direction and the Y-direction, respectively) of the rings 32 and 42, as explained above with reference to FIG. 3. The four strips 44a, 44b, 45a and 45b each include a switch 46 which may be a Pin diode. The plural number of the strips 34, and hence also the number of segments 33 of the ring 32, is a multiple of four (FIG. 4 showing this number to be eight). The strips 44a, 44b, 45a and 45b of the end coils 41 are each connected to one of the segments 33 of the ring 32. Thus, the circuit diagram of the coil 30 may be as shown in FIG. 5.

When the coil 30 is used to create a field gradient in the Y-direction, the switches 46 in the first pair of strips 44a and 44b and in one of the second pair of strips (say, 45a) of each end coil 41 are all closed and the one in the other of the second pair of strips (45b) is opened. This means that the two strips 45a of the two end coils 41 are electrically connected through one of the strips 34 of the center coil 31 and the corresponding ones of the segments 33 forming the rings 32. The same is true with each of the strips 44a and 44b of the two end coils 41. Thus, the coil 30 is now structured like the coil 10 shown in FIG. 2. So, when a driving means (not shown) establishes a current distribution by causing a current with intensity I to pass through the strips 45a and the corresponding one of the strips 34 of the center coil 31 in one longitudinal direction while a current with intensity I/2 passes through each of the second pair of the strips 44a and 44b of the end coils 41 in the opposite longitudinal direction. Those of the strips 46 of the center coil 31 not corresponding to the closed strips 45a, 45b and 46b carry no current. As a result, as explained with reference to FIG. 2, a magnetic field gradient is created in the Y-direction.

Similarly, a magnetic field gradient in X-direction is created by closing the switches 46 in the second pair of strips 45a and 45b and one of the first pair of strips (say, 44a) while opening the switch in the other of the first pair of strips 44b of the each end coil 41 and operating the driving means (not shown) to establish a current distribution such that when a current with intensity I passes through the strips 44a through a corresponding one of the strips 34 of the center coil 31 in one longitudinal direction, a current with intensity I/2 will pass through each of the first pair of the strips 45a and 45b of the end coils 41 in the opposite longitudinal direction.

Similarly as explained above, this current distribution creates a magnetic field gradient in the X-direction.

When the coil 30 is used as a detection coil, the switches 46 in the end coils 41 are all opened such that the center coil 31 functions as a detection birdcage coil as shown in FIG. 1B, activated by the driving means. Since the same current paths are used both for creating a gradient (either in the X-direction or in the Y-direction) and for detection, the coil 30 according to this invention eliminates the prior art problem of interaction between a transmitter coil and a receiver coil.

Figure 6B:
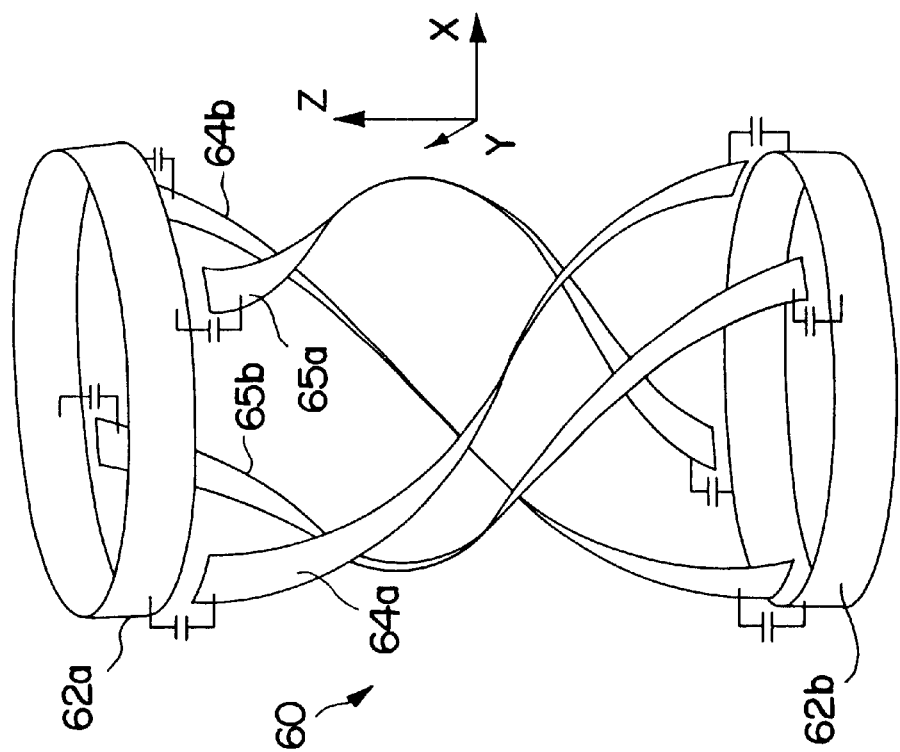
FIGS. 6A and 6B are each a schematic diagonal view of a birdcage-like coil with twisted strips embodying this invention.
Figure 6A:
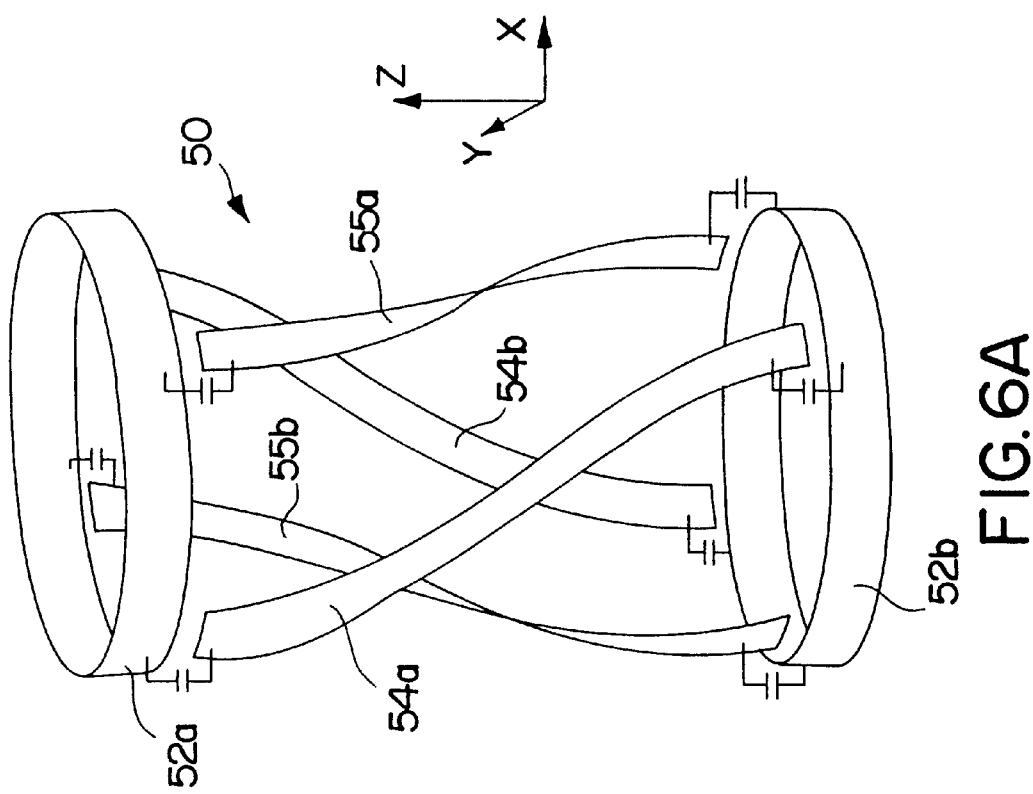

FIG. 6A shows still another coil 50 according to this invention for creating a B1 gradient in the Z-direction, characterized as being structured similarly to a birdcage B1 gradient coil 20 shown in FIG. 3. Thus, the components which are similar between the two figures are indicated by the same numerals and will not be explained repetitiously. Unlike the coil 20 shown in FIG. 3, the coil 50 has its strips (of the first pair 54a and 54b and the second pair 55a and 55b) twisted, not extending in the longitudinal direction. In other words, the coil 50 may be formed by rotating one of the rings 22 of the coil 20 by 90E with respect to the other ring 22. Thus, the first pair of strips 54a and 54b, which is on the diameter of one of the rings (the "first ring 52a") in the X-direction, is on the diameter of the other of the rings (the "second ring 52b") in the Y-direction. Similarly, the second pair of strips 55a and 55b is on the diameter of the first ring 52a in the Y-direction and on the diameter of the second ring 52b in the X-direction.

When a current distribution through the strips 54a, 54b, 55a and 55b is established, as explained above with reference to FIG. 3 for obtaining a gradient in X-direction, a gradient in X-direction will be established at the position of the first ring 52a (at the zero coordinate in the Z-direction, or at Z=0) but the gradient established at the position of the second ring 52b (at Z=h where h is the separation between the two rings 52a and 52b) will be in the Y-direction, rotated by 90E. At an intermediate position with Z-coordinate such that 0<Z<h, the direction of the magnetic field gradient (measured by the azimuthal angle θ from the X-direction will be such that 0E<<90E, varying as a function of Z. This functional relationship is dependent upon how the twisting is effected, or the relationship between the azimuthal angular position of (any of) the strips and the longitudinal position Z. The X-component of the gradient at a position Z=Z is B1 cos θ where B1 is the gradient at Z=0. Thus, by twisting the strips appropriately, it is possible to make a uniform gradient in the Z-direction.

FIG. 6B shows a coil 60 which may be considered to be a variation of the coil 50 shown in FIG. 6A and hence similar components are indicated by the same numerals for convenience. The coil 60 in FIG. 6B is different only in that the twisting of the strips 54a, 54b, 55a and 55b between the two rings 52a and 52b is by 180E, not by 90E. Thus, as one moves in the longitudinal direction from Z=0 to Z=h, the direction of gradient changes, say, from the positive X-direction to the negative X-direction. Thus, the X-component of the gradient changes monotonically from the position of the first ring 52a (Z=0) to that of the second ring 52b (Z=h). The manner in which it changes again depends on the functional relationship between the azimuthal angular position of any of the strips and longitudinal position Z.

What is claimed is:

1. A coil for generating an RF magnetic field gradient, said coil comprising:
   a pair of electrically conductive ring elements separated in a longitudinal direction, each said ring element disposed on an X-Y plane; and
   at least three electrically conductive elongated members extending in said longitudinal direction and interconnecting said ring elements at junctions which are spaced circumferentially along each of said rings,
   said at least three electrically conductive elongated members disposed asymmetrically about an X axis of said X-Y plane,
   said at least three elongated members comprising a center strip and a pair of flanking strips, said pair of flanking strips being disposed diametrically opposite each other with respect to said ring elements, said center strip being disposes at equidistance from said pair of flanking strips,
   wherein a non-uniform RF field is generated by said at least three electrically conductive elongated members within said coil.

2. The coil of claim 1 further comprising driving means for driving said coil in a mode wherein when a current passes through said central strip in one sense in said longitudinal direction, each of said flanking strips has a current passing therethrough in the opposite sense whereby a gradient magnetic field is produced in a space surrounded by said three elongated members.

3. The coil of claim 1 having no more than three of said elongated members interconnecting said ring elements.

4. The coil of claim 2 having no more than three of said elongated members interconnecting said ring elements.

5. The coil of claim 1 wherein each of said three elongated members is capacitively coupled to each of said ring members.

6. The coil of claim 2 wherein each of said three elongated members is capacitively coupled to each of said ring members.

7. A coil for generating two switchable orthogonal magnetic field gradients, said coil comprising:
   a pair of electrically conductive ring elements separated in a longitudinal direction, each said ring element disposed on an X-Y plane; and
   at least two pairs, consisting of a first pair and a second pair, of electrically conductive elongated member extending in said longitudinal direction and interconnecting said ring elements at junctions which are spaced circumferentially along each of said rings,
   said first pair disposed asymmetrically about an X-axis and said second pair disposed asymmetrically about an Y-axis of said X-Y plane,
   said elongated members of each of said pairs being disposed diametrically opposite each other with respect to said ring elements, said two pairs of elongated members being aligned mutually perpendicularly to each other,
   wherein a non-uniform RF field is provided by one of said at least two pairs of electrically conductive elongated members within said coil.

8. The coil of claim 7 further comprising driving means for driving coil selectably in a first mode, wherein a current is passed in one sense through one of said elongated members of said first pair and returned divided through said second pair of elongated members in the opposite sense, and in a second mode, wherein a current is passed in one sense through one of said elongated members of said second pair and returned divided through said second first pair of elongated members in the opposite sense, whereby two switchable orthogonal magnetic field gradients are alternatively produced in a space surrounded by said two pairs of elongated members.

9. The coil of claim 7 wherein each of said elongated members is capacitively coupled to each of said ring members.

10. The coil of claim 8 wherein each of said elongated members is capacitively coupled to each of said ring members.

11. A coil for generating alternatively a homogeneous RF field and selectably one of two orthogonal gradient fields transverse to said homogeneous RF field, said coil comprising:

a center coil with a high-pass birdcage configuration, having a pair of electrically conductive ring elements separated in a longitudinal direction and a plurality of electrically conductive elongated members extending in said longitudinal direction and interconnecting said ring elements at junctions which are spaced circumferentially along each of said ring elements, each of said ring elements being divided into segments, each of said segments containing one of said junctions, each mutually adjacent pair of said segments being capacitively coupled to each other; and a pair of end coils sandwiching said center coil therebetween, each of said end coils comprising an electrically conductive ring and at least two pairs, consisting of a first pair and a second pair, of electrically conductive elongated strips extending in said longitudinal direction and interconnecting said ring at junction points which are spaced circumferentially along said ring and one of said segments of a corresponding one of said ring elements, each of said strips containing a switch and being capacitively coupled to said ring, said strips of said two pairs being disposed at opposite ends of mutually perpendicular diameters of said end ring.

12. The coil of claim 11 further comprising driving means for driving said coil selectably in a first mode wherein the switches in the strips of said end coils are all opened such that said center coil functions as a high-pass birdcage coil and generates a homogenous field, and in a second mode wherein the switches of said end coils are all closed except that a selected one of the pairs of each of said end coils is opened such that said end coils produce a field gradient in a selected direction perpendicular to said longitudinal direction.

13. A coil for generating a B1 gradient in a specified longitudinal direction, said coil comprising:

a pair of electrically conductive ring elements separated in a longitudinal direction; and at least two pairs, consisting of a first pair and a second pair, of electrically conductive twistingly elongated members interconnecting said ring elements at junctions which are spaced circumferentially along each of said rings, each of said members being twisted azimuthally by a specified angle to interconnected said pair of rings, said members of each of said pairs being disposed diametrically opposite each other with respect to said ring elements on any plane perpendicular to said longitudinal direction between said pair of rings, said two pairs of members being evenly spaced azimuthally with respect to said longitudinal direction.

14. The coil of claim 13 wherein said said specified angle is 90E.

15. The coil of claim 13 wherein said said specified angle is 180E.

* * * * *